(12) United States Patent
Kimura et al.

(10) Patent No.: US 9,379,225 B2
(45) Date of Patent: Jun. 28, 2016

(54) SEMICONDUCTOR DEVICE

(71) Applicants: Keisuke Kimura, Nagakute (JP); Satoru Kameyama, Toyota (JP); Masaki Koyama, Toyota (JP); Sachiko Aoi, Nagoya (JP)

(72) Inventors: Keisuke Kimura, Nagakute (JP); Satoru Kameyama, Toyota (JP); Masaki Koyama, Toyota (JP); Sachiko Aoi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/767,370

(22) PCT Filed: Feb. 13, 2013

(86) PCT No.: PCT/JP2013/053419
§ 371 (c)(1),
(2) Date: Aug. 12, 2015

(87) PCT Pub. No.: WO2014/125584
PCT Pub. Date: Aug. 21, 2014

(65) Prior Publication Data
US 2016/0005844 A1    Jan. 7, 2016

(51) Int. Cl.
*H01L 29/739* (2006.01)
*H01L 29/06* (2006.01)
*H01L 29/08* (2006.01)
*H01L 29/10* (2006.01)
*H01L 27/06* (2006.01)

(52) U.S. Cl.
CPC ........ *H01L 29/7397* (2013.01); *H01L 27/0629* (2013.01); *H01L 27/0664* (2013.01); *H01L 29/0696* (2013.01); *H01L 29/0834* (2013.01); *H01L 29/1095* (2013.01)

(58) Field of Classification Search
None
See application file for complete search history.

(56) References Cited

U.S. PATENT DOCUMENTS

| 2005/0056906 | A1* | 3/2005 | Jimbo | H01L 27/067 257/492 |
|---|---|---|---|---|
| 2012/0043581 | A1 | 2/2012 | Koyama et al. | |
| 2012/0199900 | A1 | 8/2012 | Oosawa et al. | |
| 2014/0334212 | A1* | 11/2014 | Hashimoto | H01L 27/0727 363/131 |

FOREIGN PATENT DOCUMENTS

| JP | 2009-141202 A | 6/2009 |
|---|---|---|
| JP | 2012-043890 A | 3/2012 |
| JP | 2012-164854 A | 8/2012 |

* cited by examiner

*Primary Examiner* — Bilkis Jahan
*Assistant Examiner* — Kevin Quinto
(74) *Attorney, Agent, or Firm* — Oliff PLC

(57) ABSTRACT

A semiconductor device in which an IGBT region and a diode region are formed on one semiconductor substrate is disclosed. The IGBT region includes: a body layer of a first conductivity type that is formed on a front surface of the semiconductor substrate; a body contact layer of the first conductivity type that is partially formed on a front surface of the body layer and has a higher impurity concentration of the first conductivity type than the body layer; an emitter layer of a second conductivity type that is partially formed on the front surface of the body layer; a drift layer; a collector layer; and a gate electrode. In the semiconductor device, a part of the body contact layer placed at a long distance from the diode region is made larger than a part of the body contact layer placed at a short distance from the diode region.

5 Claims, 7 Drawing Sheets

SEMICONDUCTOR DEVICE

TECHNICAL FIELD

The technology described herein relates to a semiconductor device.

BACKGROUND ART

JP 2012-43890 A discloses a semiconductor device in which an IGBT region and a diode region are formed on one semiconductor substrate. The IGBT region includes: a body layer of a first conductivity type that is formed on a front surface of the semiconductor substrate; a body contact layer of the first conductivity type that is partially formed on a front surface of the body layer and that has a higher impurity concentration of the first conductivity type than the body layer; an emitter layer of a second conductivity type that is partially formed on the front surface of the body layer; a drift layer of the second conductivity type that is formed on a back surface side of the body layer; a collector layer of the first conductivity type that is formed on a back surface side of the drift layer; and a gate electrode covered with an insulator film and placed inside a trench. Such a semiconductor device is referred to a reverse conductive (RC) IGBT, which sometimes operates as an IGBT and at other times operates as a diode.

SUMMARY OF INVENTION

Technical Problem

When the semiconductor device operates as a diode, a parasitic diode in the IGBT region, as well as in the diode region, contributes to the operation. During diode operation, holes are injected from the body contact layer of the IGBT region into the drift layer. Therefore, in order to reduce a switching loss during diode operation, it is effective to reduce the amount of holes that are injected from the body contact layer into the drift layer. Reducing the size of the body contact layer of the IGBT region reduces the amount of holes injected into the drift layer from the body contact layer, thereby reducing a switching loss during diode operation. However, a reduction in size of the body contact layer of the IGBT region causes a lowering of avalanche resistance during IGBT operation.

The present specification provides a technology for solving the problem described above. The present specification provides a technology for enabling a semiconductor device in which an IGBT region and a diode region are formed on one semiconductor substrate to reduce a switching loss during diode operation while ensuring avalanche resistance during IGBT operation.

Solution to Technical Problem

The present specification discloses a semiconductor device in which an IGBT region and a diode region are formed on one semiconductor substrate. The IGBT region includes: a body layer of a first conductivity type that is formed on a front surface of the semiconductor substrate; a body contact layer of the first conductivity type that is partially formed on a front surface of the body layer and has a higher impurity concentration of the first conductivity type than the body layer; an emitter layer of a second conductivity type that is partially formed on the front surface of the body layer; a drift layer of the second conductivity type that is formed on a back surface side of the body layer; a collector layer of the first conductivity type that is formed on a back surface side of the drift layer; and a gate electrode covered with an insulator film and placed inside a trench. In the semiconductor device, a part of the body contact layer placed at a long distance from the diode region is made larger than a part of the body contact layer placed at a short distance from the diode region.

The inventors of the present application found that an avalanche current that is generated when the IGBT region is turned off during IGBT operation is not evenly distributed throughout the IGBT region, but is concentrated in a central part of the IGBT region, i.e. a part of the IGBT region that is far from the diode region. In the semiconductor device described above, the body contact layer is made large in a part of the IGBT region in which the avalanche current is concentrated. This configuration makes it possible to ensure avalanche resistance during IGBT operation.

Further, in the semiconductor device described above, the body contact layer can be made small in a peripheral part of the IGBT region through which little of the avalanche current flows, i.e. a part of the IGBT region that is close to the diode region. This configuration suppresses the injection of holes into the drift layer during diode operation, thus making it possible to reduce a switching loss during diode operation.

DESCRIPTION OF EMBODIMENTS

The semiconductor device disclosed herein may be configured such that a part of the body contact layer placed in a part of the IGBT region in which trench pitch is wide is made larger than a part of the body contact layer placed in a part of the IGBT region in which trench pitch is narrow.

In the case of trenches formed with nonuniform pitches, at the time of avalanche breakdown, an electric field is concentrated in the part of the IGBT region in which trench pitch is wide, so that an avalanche current concentratedly flows through that part. Given this situation, a part of the body contact layer placed in the part of the IGBT region in which trench pitch is wide is made large. This makes it possible to ensure avalanche resistance during IGBT operation. Further, a part of the body contact layer placed in the part of the IGBT region in which trench pitch is narrow is made small. This suppresses the injection of holes into the drift layer, thus making it possible to reduce a switching loss during diode operation.

The semiconductor device disclosed herein may be configured such that a part of the body contact layer placed near a part of the IGBT region in which trench depth is great is made larger than a part of the body contact layer placed near a part of the IGBT region in which trench depth is shallow.

In the case of trenches formed with nonuniform depths, at the time of avalanche breakdown, an electric field is concentrated on the part of the IGBT region in which trench depth is great, so that an avalanche current concentratedly flows through an area near that part. Given this situation, a part of the body contact layer placed near the part of the IGBT region in which trench depth is great is made large. This makes it possible to ensure avalanche resistance during IGBT operation. Further, a part of the body contact layer placed near the part of the IGBT region in which trench depth is shallow is made small. This suppresses the injection of holes into the drift layer, thus making it possible to reduce a switching loss during diode operation.

EMBODIMENTS

Figure 1:
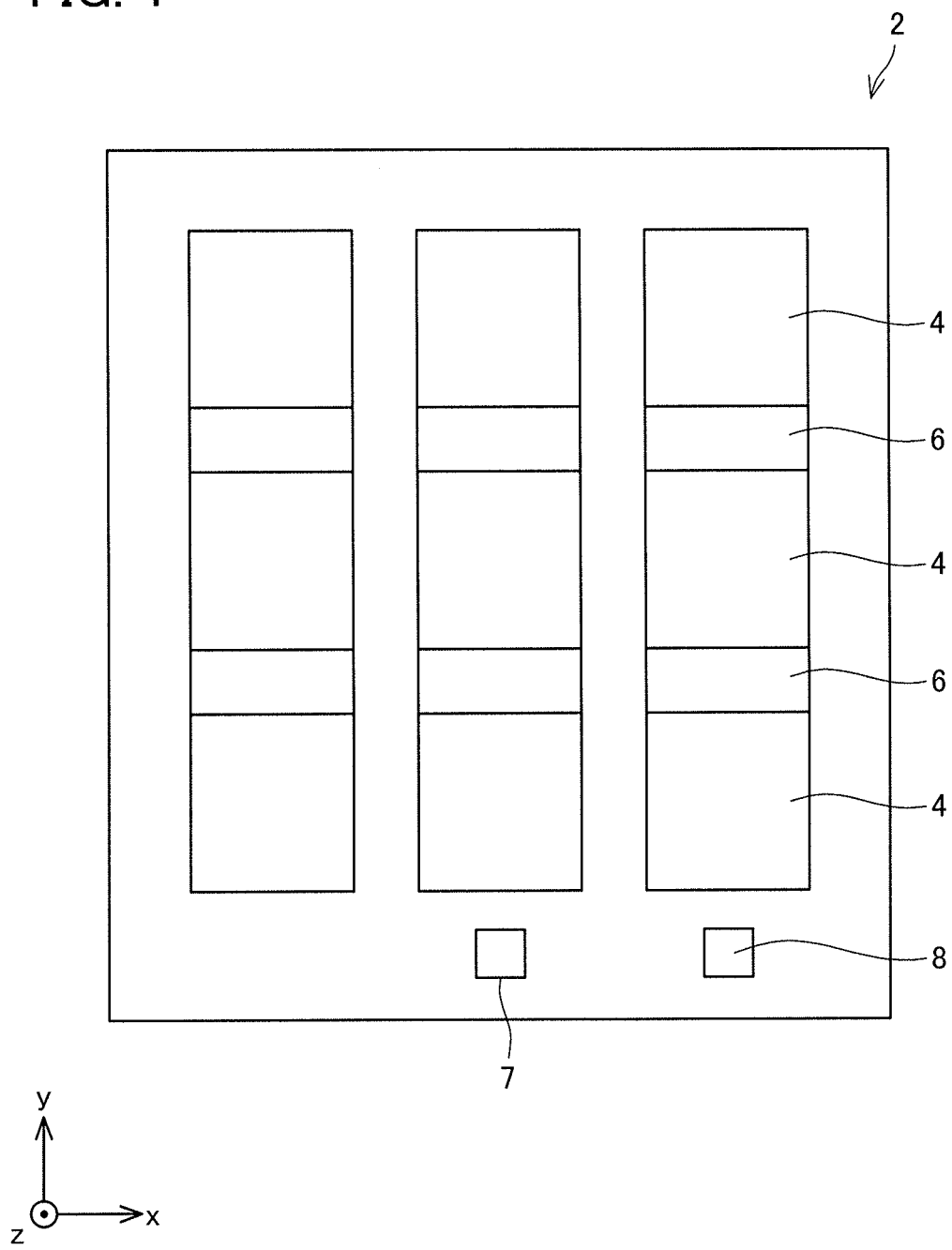
FIG. 1 is a plan view of a semiconductor device 2 of an embodiment.

FIG. 1 shows a semiconductor device 2 of the present embodiment. The semiconductor device 2 includes an IGBT region 4, a diode region 6, and a sense region 8. The IGBT region 4, the diode region 6, and the sense region 8 are formed on the same semiconductor substrate. The semiconductor device 2 is a so-called reverse conductive (RC) IGBT.

On a front surface of the semiconductor substrate, a plurality of trenches 10 (see FIG. 2) are formed parallel to each other. In the semiconductor device 2, a plurality of IGBT regions 4 and a plurality of diode regions 6 are placed alternately in a direction (y direction) orthogonal to a direction (x direction) in which the trenches 10 extend. FIG. 1 illustrates a case where three IGBT regions 4 and two diode region 6 are placed alternately. However, the numbers of IGBT regions 4 and diode regions 6 are not limited to these numbers.

Figure 2:
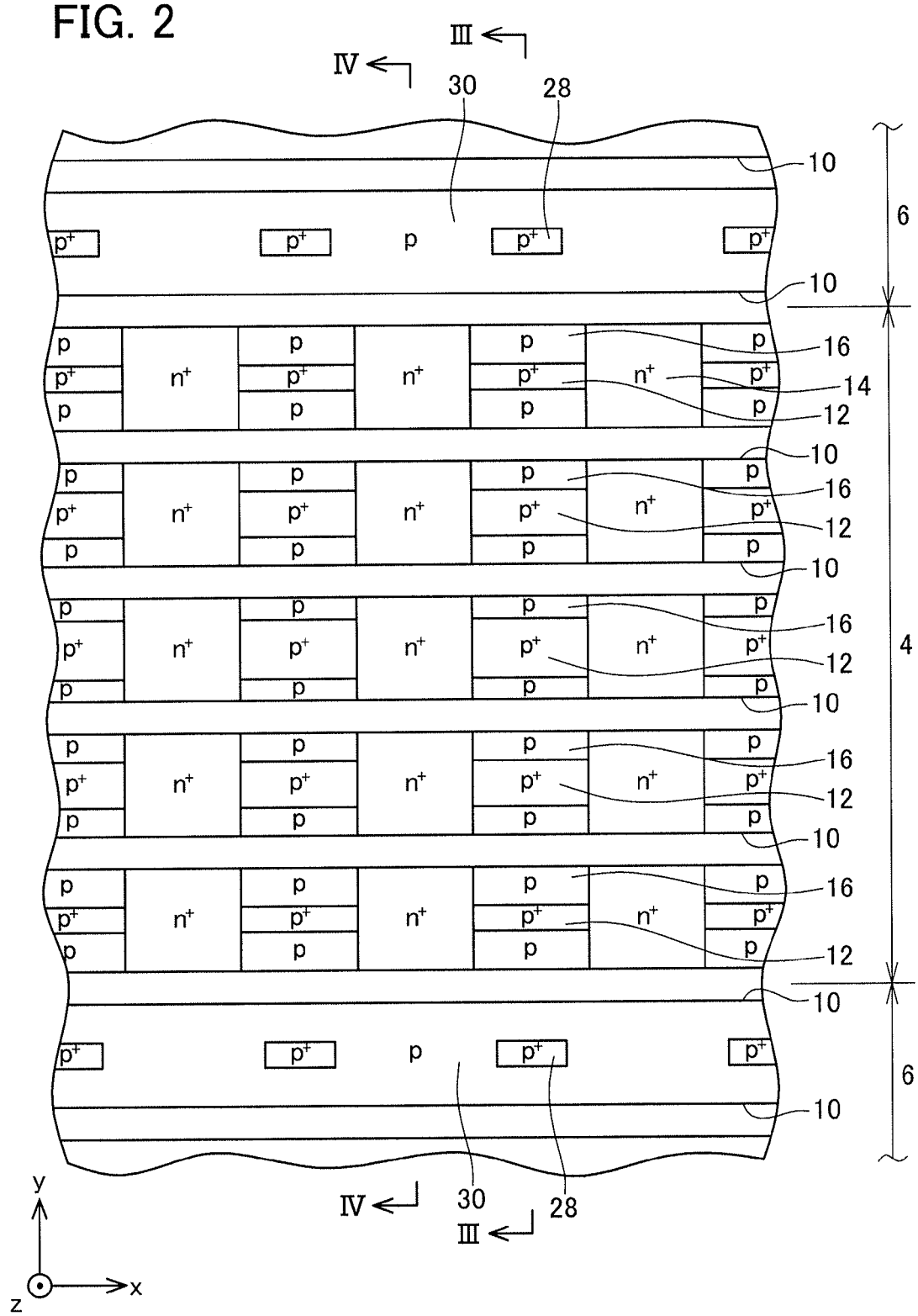
FIG. 2 is a plan view showing the details of an IGBT region 4 of the semiconductor device 2 of the embodiment.
Figure 3:
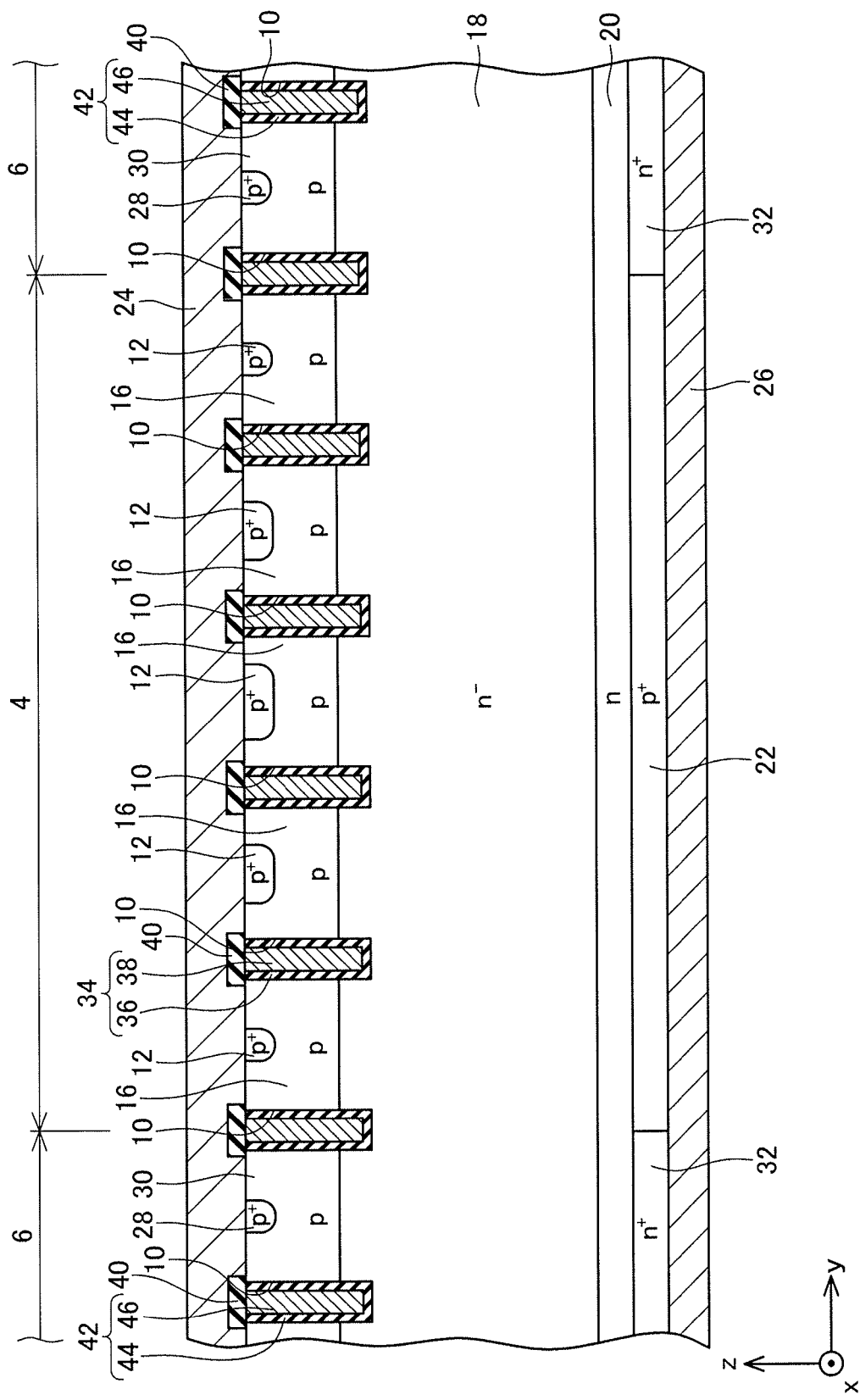
FIG. 3 is a cross-sectional view taken along the line of FIG. 2.
Figure 4:
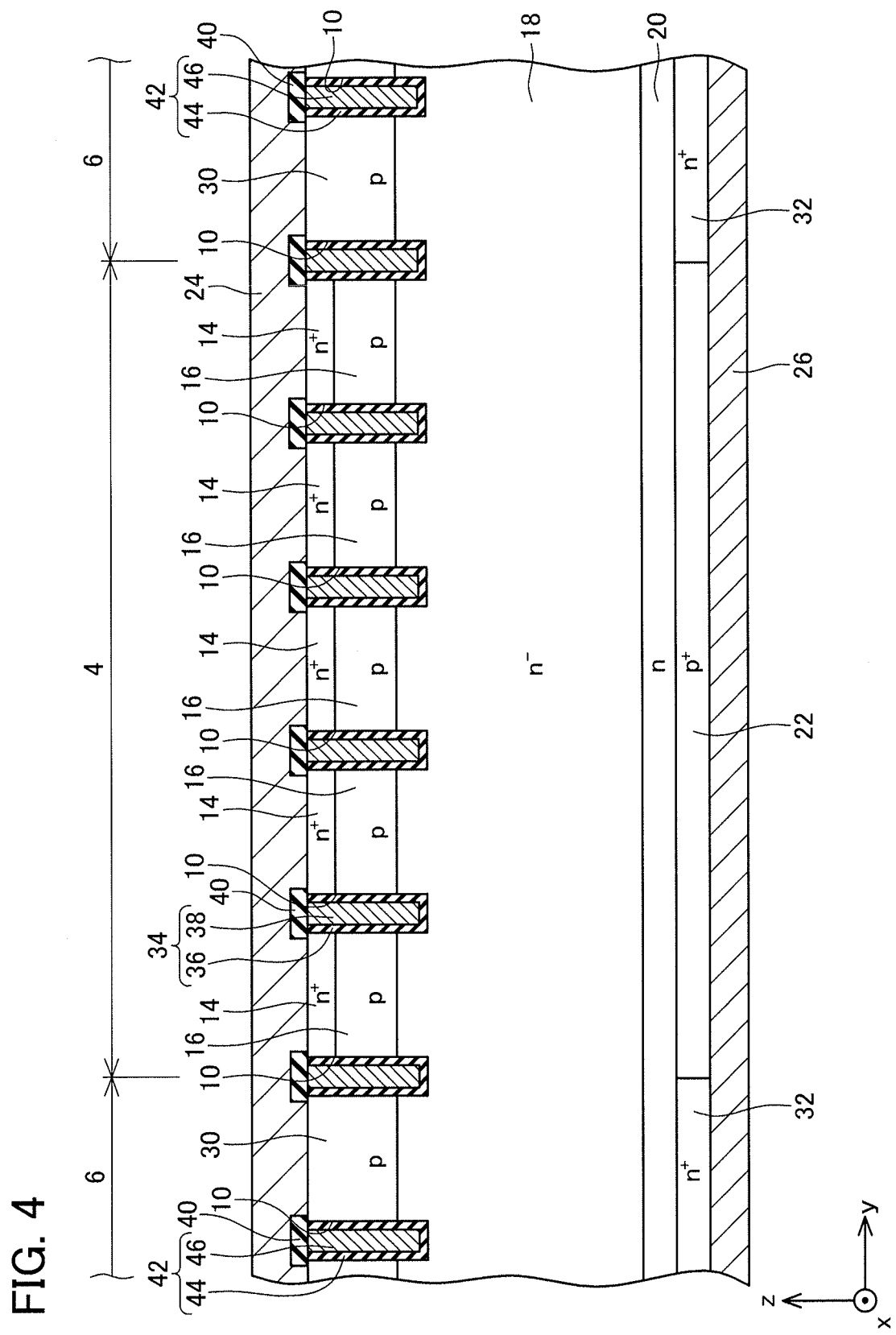
FIG. 4 is a cross-sectional view taken along the line IV-IV of FIG. 2.

FIGS. 2 to 4 show the details of each of the IGBT regions 4. It should be noted that FIG. 2 omits to illustrate the below-mentioned front surface electrode 24, insulated gate 34, front surface insulator film 40, and dummy gate 42. As shown in FIGS. 2 to 4, the IGBT region 4 includes: a body contact layer 12 made of a p-type semiconductor having a high impurity concentration; an emitter layer 14 made of an n-type semiconductor having a high impurity concentration; a body layer 16 made of a p-type semiconductor; a drift layer 18 made of an n-type semiconductor having a low impurity concentration; a buffer layer 20 made of an n-type semiconductor; and a collector layer 22 made of a p-type semiconductor having a high impurity concentration. The body contact layer 12, the emitter layer 14, and the body layer 16 are exposed on the front surface of the semiconductor substrate, and are in contact with the front surface electrode 24. The body contact layer 12 and the emitter layer 14 are partially formed in a surface layer portion of the body layer 16. The drift layer 18 is formed on a back surface of the body layer 16. The buffer layer 20 is formed on a back surface of the drift layer 18. The collector layer 22 is formed on a back surface of the buffer layer 20. The collector layer 22 is exposed on a back surface of the semiconductor substrate, and is in contact with a back surface electrode 26.

Each of the diode regions 6 includes: an anode contact layer 28 made of a p-type semiconductor having a high impurity concentration; an anode layer 30 made of a p-type semiconductor, a drift layer 18 made of an n-type semiconductor having a low impurity concentration; a buffer layer 20 made of an n-type semiconductor; and a cathode layer 32 made of an n-type semiconductor having a high impurity concentration. The anode contact layer 28 and the anode layer 30 are exposed on the front surface of the semiconductor substrate, and are in contact with the front surface electrode 24. The anode contact layer 28 is partially formed in a surface layer portion of the anode layer 30. The drift layer 18 is formed on a back surface of the anode layer 30. The buffer layer 20 is formed on a back surface of the drift layer 18. The cathode layer 32 is formed on a back surface of the buffer layer 20. The cathode layer 32 is exposed on the back surface of the semiconductor substrate, and is in contact with the back surface electrode 26.

In the semiconductor device 2, the drift layer 18 of the IGBT region 4 and the drift layer 18 of the diode region 6 are formed as a common layer. In the semiconductor device 2, the buffer layer 20 of the IGBT region 4 and the buffer layer 20 of the diode region 6 are formed as a common layer. Further, in the semiconductor device 2, the body layer 16 of the IGBT region 4 and the anode layer 30 of the diode region 6 are formed as a common layer. In other words, the body layer 16 of the IGBT region 4 and the anode layer 30 of the diode region 6 are at the same depth from the front surface of the semiconductor substrate, and have the same impurity concentration.

In the IGBT region 4, each of the trenches 10 extends from a front surface side of the semiconductor substrate into the drift layer 18 through the body layer 16. In the IGBT region 4, an insulated gate 34 is formed on each of the trenches 10. The insulated gate 34 includes a gate insulator film 36 and a gate electrode 38. The gate insulator film 36 is formed on an inner wall of the trench 10. The gate electrode 38 is covered with the gate insulator film 36 and fills the trench 10. The gate electrode 38 is insulated from the front surface electrode 24 by a front surface insulator film 40. The gate electrode 38 is electrically connected to a gate electrode terminal 7 (see FIG. 1). FIG. 2 illustrates a case where a single IGBT region 4 is divided into five regions by trenches 10. However, the number of regions into which a single IGBT region 4 is divided is not limited to this number.

In the diode region 6, each of the trenches 10 extends from the front surface side of the semiconductor substrate into the drift layer 18 through the anode layer 30. In the diode region 6, a dummy gate 42 is formed on each of the trenches 10. The dummy gate 42 includes a dummy gate insulator film 44 and a dummy gate electrode 46. The dummy gate insulator film 44 is formed on an inner side of the trench 10. The dummy gate electrode 46 is covered with the dummy gate insulator film 44 and fills the trench 10. In FIGS. 3 and 4, the dummy gate electrode 46 is insulated from the front surface electrode 24 by a front surface insulator film 40, but in a part that is not illustrated, the dummy gate electrode 46 is in contact with the front surface electrode 24 and the dummy gate electrode 46 and the front surface electrode 24 are electrically connected to each other.

The sense region 8 includes the same configuration as that of the IGBT region 4. The sense region 8 is used for detecting the magnitude of a current that flows between the front surface electrode 24 and the back surface electrode 26.

In the IGBT region 4, as shown in FIG. 2, the emitter layer 14 is placed between two trenches 10 that are placed side by side, and extends from one of the trenches 10 to another of the trenches 10 in the direction (y direction of the drawing) orthogonal to the direction (x direction of the drawing) in which the trenches 10 extend. When the semiconductor substrate is seen from above, the body layer 16 is divided into rectangular areas by the trenches 10 and the emitter layer 14, and the body contact layer 12 is placed near the center of each of the areas into which the body layer 16 is divided.

In the semiconductor device 2 of the present embodiment, the body contact layer 12 of the IGBT region 4 varies in size from one position to another. In the present embodiment, a part of the body contact layer 12 placed at a short distance from the diode region 6 is made small in width in the direction (y direction) orthogonal to the direction (x direction) in which the trenches 10 extend, and a part of the body contact layer 12 placed at a long distance from the diode region 6 is made large in width in the direction (y direction) orthogonal to the direction (x direction) in which the trenches 10 extend. That is, the part of the body contact layer 12 placed at a short distance from the diode region 6 is made small, and the part of the body contact layer 12 placed at a long distance from the diode region 6 is made large. In other words, a part of the body contact layer 12 placed in a peripheral part of the IGBT region 4 is made small, and a part of the body contact layer 12 placed in a central part of the IGBT region 4 is made large.

When the semiconductor device 2 performs IGBT operation, the avalanche current when the IGBT region 4 is turned off concentratedly flows through a part of the body contact layer 12 placed in the center of the IGBT region 4. In other words, the avalanche current concentratedly flows through a part of the body contact layer 12 placed at a long distance from the diode region 6 in the IGBT region 4. In the semiconductor device 2 of the present embodiment, the part of the body contact layer 12 in which the avalanche current is concentrated is made large. This makes it possible to ensure avalanche resistance during IGBT operation.

In the semiconductor device 2 of the present embodiment, the body contact layer 12 is made small in a part of the IGBT region 4 in which the avalanche current is not concentrated (which can be referred to as a peripheral part of the IGBT region 4 or as a part of the IGBT region 4 placed at a short distance from the diode region 6). This configuration reduces the amount of holes that are injected from the body contact layer 12 into the drift layer 18 during diode operation. This brings about an improvement in reverse recovery characteristic during diode operation, thus making it possible to reduce a switching loss.

Figure 5:
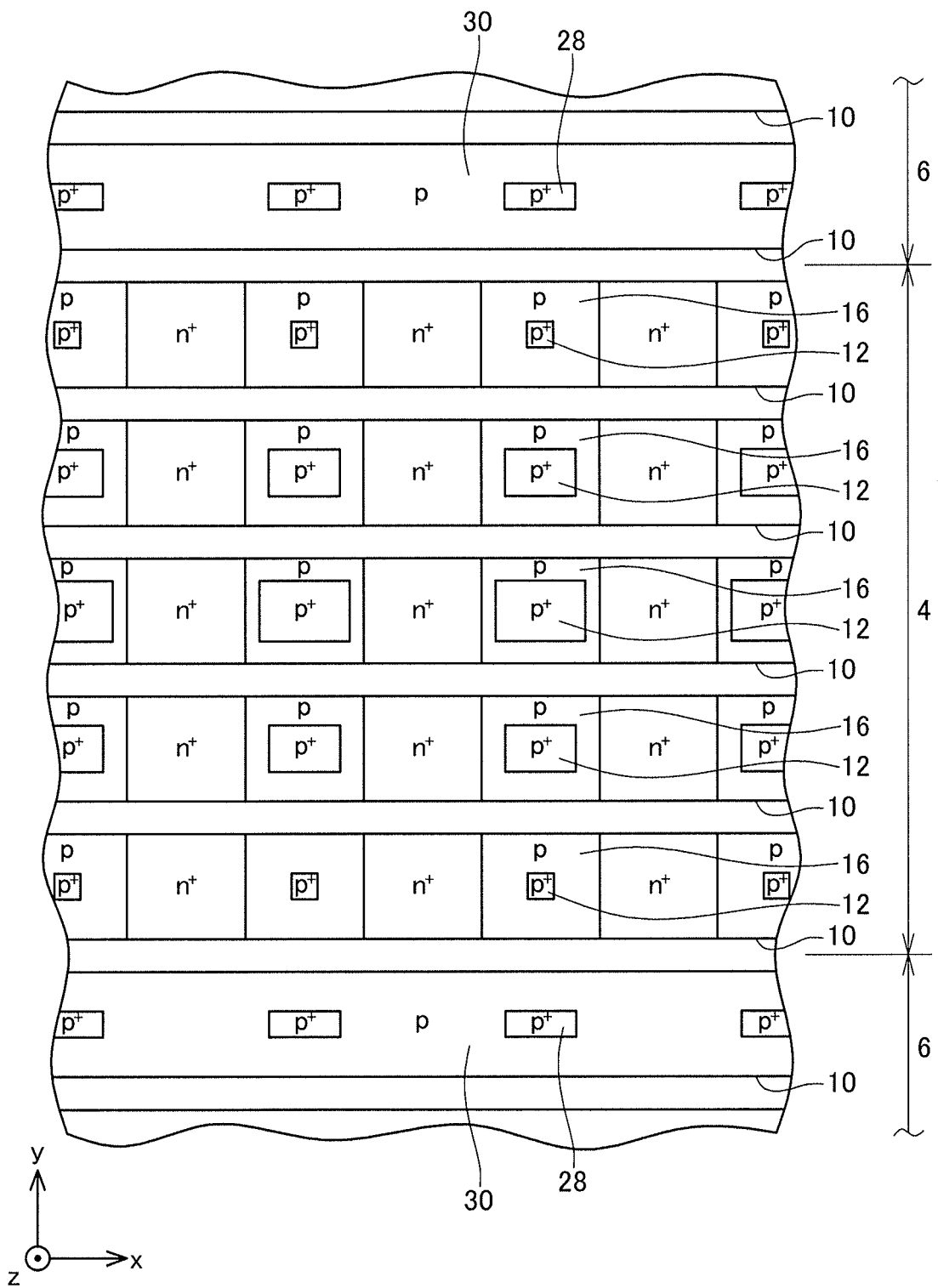
FIG. 5 is a plan view showing the details of an IGBT region 4 of a semiconductor device 2 of a modification.

As shown in FIG. 5, such a configuration is possible that both the widths of the body contact layer 12 in the x direction (i.e. the direction in which the trenches 10 extend) and in the y direction (i.e. the direction orthogonal to the direction in which the trenches 10 extend) are larger with increasing distance from the diode region 6.

In the embodiment described above, a case has been described where the IGBT regions 4 and the diode regions 6 form a structure that is in the shape of stripes extending along the trenches 10. However, the IGBT regions 4 and the diode regions 6 may form a structure of another shape.

In the embodiment described above, a case has been described where the IGBT regions 4 and the diode regions 6 are placed alternately in the direction (y direction) orthogonal to the direction (x direction) in which the trenches 10 extend, however the way in which the IGBT regions 4 and the diode regions 6 are placed is not limited to this case. For example, when the semiconductor device 2 is viewed from above, the diode regions 6 may be placed in the shape of a circle or in the shape of a rectangle, and the IGBT regions 4 may be placed around the diode regions 6.

In the embodiment described above, a case has been described where the body contact layer 12 is in a rectangular shape when the semiconductor device 2 is viewed from above. However, the body contact layer 12 may be formed in another shape such as a circular shape or a triangular shape.

In the embodiment described above, a case has been described where the trenches 10 are uniform in trench pitch and trench depth in the IGBT region 4. However, the trenches 10 may be nonuniform in trench pitch and trench depth in a part of the IGBT region 4.

Figure 6:
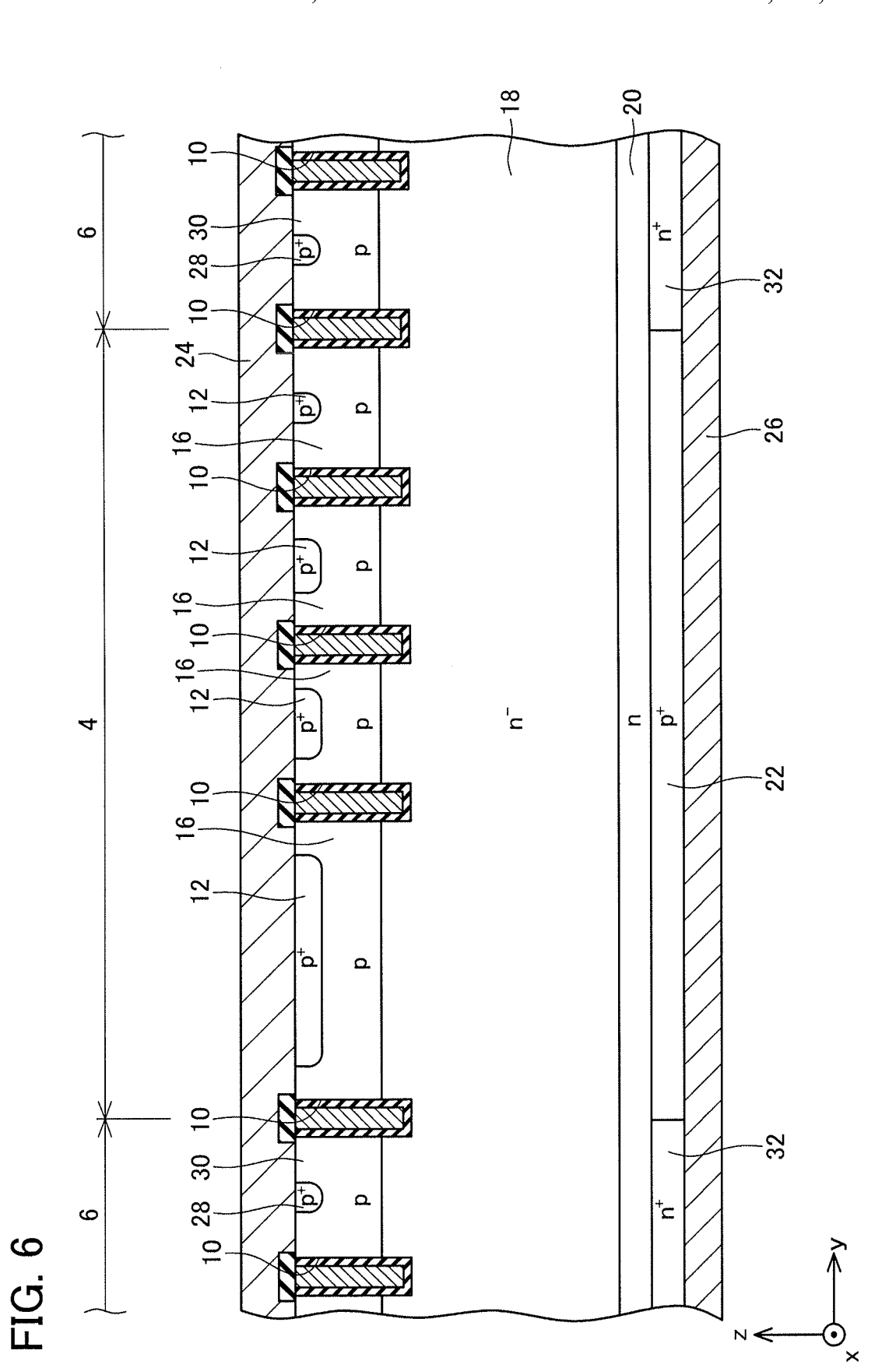
FIG. 6 is a cross-sectional view of an IGBT region 4 of a semiconductor device 2 of a modification.

FIG. 6 shows a configuration in which the trenches 10 are nonuniform in trench pitch in a part of the IGBT region 4. On a part of the IGBT region 4 in which trench pitch is wide, as compared with a part of the IGBT region 4 in which trench pitch is narrow, an electric field at the time of avalanche breakdown is concentrated, thus making it easy for an avalanche current to be concentrated. Given these circumstances, as shown in FIG. 6, the body contact layer 12 placed in the part of the IGBT region 4 in which trench pitch is wide is made large, and a part of the body contact layer 12 placed in the part of the IGBT region 4 in which trench pitch is narrow is made small. This makes it possible to reduce a switching loss during diode operation while ensuring avalanche resistance during IGBT operation.

Figure 7:
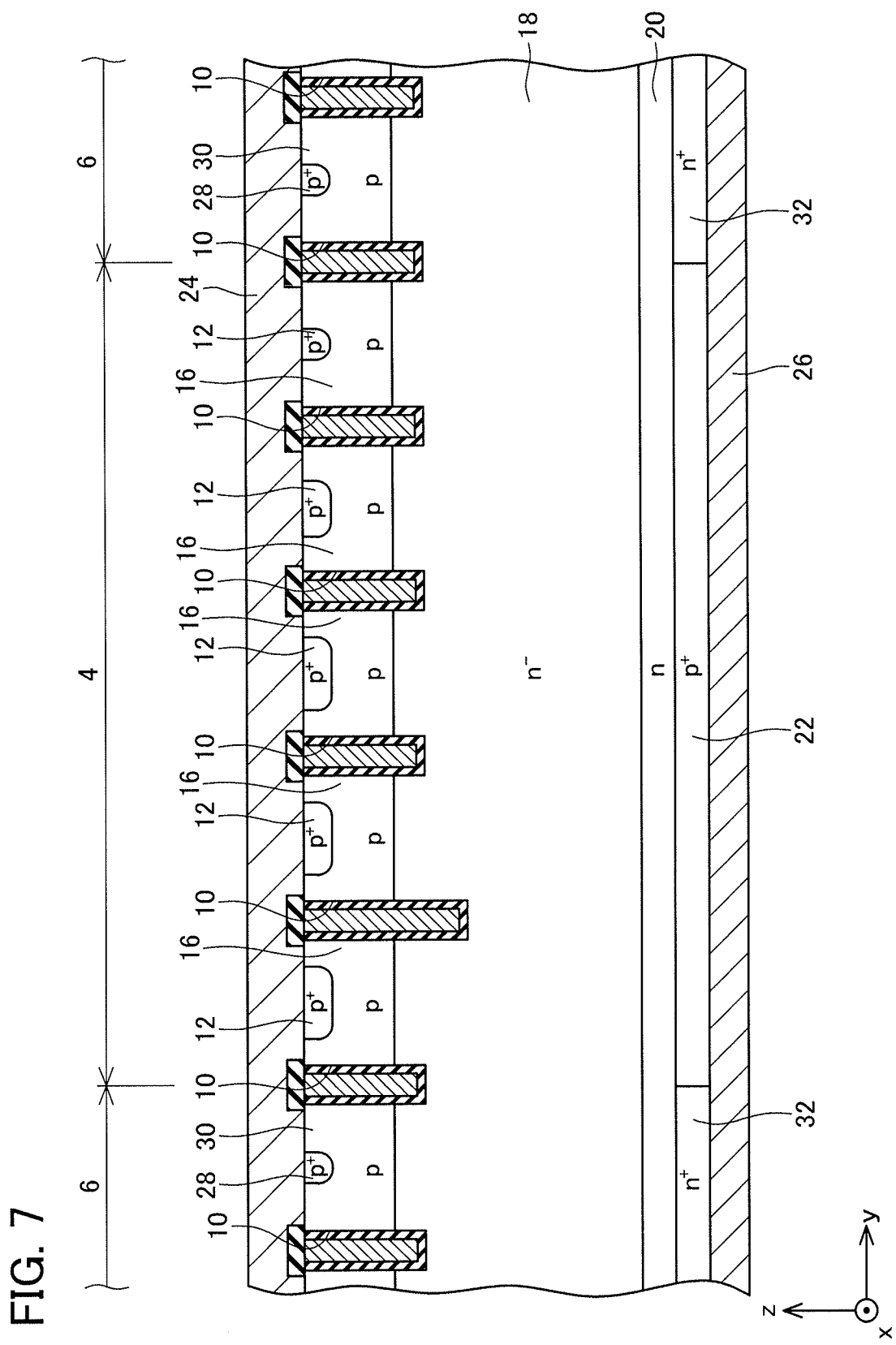
FIG. 7 is a cross-sectional view of an IGBT region 4 of a semiconductor device 2 of a modification.

FIG. 7 shows a configuration in which the trenches 10 are nonuniform in trench depth in a part of the IGBT region 4. On a part of the IGBT region 4 in which trench depth is great, as compared with a part of the IGBT region 4 in which trench depth is shallow, an electric field at the time of avalanche breakdown is concentrated, thus making it easy for an avalanche current to be concentrated. Given these circumstances, as shown in FIG. 7, a part of the body contact layer 12 placed near the part of the IGBT region 4 in which trench depth is great is made large, and a part of the body contact layer 12 placed near the part of the IGBT region 4 in which trench depth is shallow is made small. This makes it possible to reduce a switching loss during diode operation while ensuring avalanche resistance during IGBT operation.

It should be noted that the features described above can be combined with one another. That is, such a configuration is possible that a part of the body contact layer 12 placed at a long distance from the diode region 6 is made relatively larger than a part of the body contact layer 12 placed at a short distance from the diode region 6, and/or that a part of the body contact layer 12 placed in the part of the IGBT region 4 in which trench pitch is wide is made relatively larger than a part of the body contact layer 12 placed in the part of the IGBT region 4 in which trench pitch is narrow, and/or that a part of the body contact layer 12 placed near the part of the IGBT region 4 in which trench depth is great is made relatively larger than a part of the body contact layer 12 placed near the part of the IGBT region 4 in which trench depth is shallow. This configuration makes it possible to reduce a switching loss during diode operation while ensuring avalanche resistance during IGBT operation.

Representative and non-limiting specific examples of the present invention are explained in detail with reference to the attached drawings. The detailed explanation is simply intended to illustrate the details of for putting the preferred embodiments of the present invention into practice to those skilled in the art and not intended to limit the scope of the present invention. Moreover, the disclosed additional features and inventions can be used for providing a further improved semiconductor device separately from or together with the other features and inventions.

Moreover, the combinations of the features and processes disclosed in the above-described detailed explanation are not indispensable when the present invention is put into practice in the widest meaning but described only for particularly explaining a representative specific example of the present invention. Moreover, the various features of the above-described representative specific examples and the various features of those described in claims do not have to be combined as in the specific examples described herein or in accordance with the enumerated orders in providing additional and useful embodiments of the present invention.

All the features described in the present specification and/or claims are intended to be disclosed as limitation to the specified matters described in the disclosure of the original application and claims individually and independently from each other, separately from the configurations of the features described in the embodiments and/or claims. Moreover, the descriptions relating to all the numerical value ranges and groups or collections are intended to disclose those intermediate configurations as limitation to the specified matters described in the disclosure of the original application and claims.

The specific examples of the present invention has been explained in detail as above but they are only exemplifications and do not limit claims. The technology described in claims includes various variations and changes of the above-exemplified specific examples. The technical elements explained in this specification or the attached drawings exert technical usability singularly or by various combinations and are not limited to the combinations described in claims at the filing. Moreover, the technology exemplified in this specification or the attached drawings is capable of achieving a plurality of objects at the same time, and achievement of any one of those objects itself has technical usability.

The invention claimed is:

1. A semiconductor device in which an IGBT region and a diode region are formed on one semiconductor substrate, the IGBT region comprising:
  a body layer of a first conductivity type that is formed on a front surface of the semiconductor substrate;
  a body contact layer of the first conductivity type that is partially formed on a front surface of the body layer, the body contact layer having a higher impurity concentration of the first conductivity type than the body layer;
  an emitter layer of a second conductivity type that is partially formed on the front surface of the body layer;
  a drift layer of the second conductivity type that is formed on a back surface side of the body layer;
  a collector layer of the first conductivity type that is formed on a back surface side of the drift layer; and
  a gate electrode covered with an insulator film and placed inside a trench,
  wherein
  a part of the body contact layer placed at a long distance from the diode region is made larger than a part of the body contact layer placed at a short distance from the diode region.

2. The semiconductor device as set forth in claim 1, wherein
  a part of the body contact layer placed in a part of the IGBT region in which trench pitch is wide is made larger than a part of the body contact layer placed in a part of the IGBT region in which trench pitch is narrow.

3. The semiconductor device as set forth in claim 1, wherein
  a part of the body contact layer placed near a part of the IGBT region in which trench depth is great is made larger than a part of the body contact layer placed near a part of the IGBT region in which trench depth is shallow.

4. A semiconductor device in which an IGBT region and a diode region are formed on one semiconductor substrate, the IGBT region comprising:
  a body layer of a first conductivity type that is formed on a front surface of the semiconductor substrate;
  a body contact layer of the first conductivity type that is partially formed on a front surface of the body layer, the body contact layer having a higher impurity concentration of the first conductivity type than the body layer;
  an emitter layer of a second conductivity type that is partially formed on the front surface of the body layer;
  a drift layer of the second conductivity type that is formed on a back surface side of the body layer;
  a collector layer of the first conductivity type that is formed on a back surface side of the drift layer; and
  a gate electrode covered with an insulator film and placed inside a trench,
  wherein
  a part of the body contact layer placed in a part of the IGBT region in which trench pitch is wide is made larger than a part of the body contact layer placed in a part of the IGBT region in which trench pitch is narrow.

5. A semiconductor device in which an IGBT region and a diode region are formed on one semiconductor substrate, the IGBT region comprising:
  a body layer of a first conductivity type that is formed on a front surface of the semiconductor substrate;
  a body contact layer of the first conductivity type that is partially formed on a front surface of the body layer, the body contact layer having a higher impurity concentration of the first conductivity type than the body layer;
  an emitter layer of a second conductivity type that is partially formed on the front surface of the body layer;
  a drift layer of the second conductivity type that is formed on a back surface side of the body layer;
  a collector layer of the first conductivity type that is formed on a back surface side of the drift layer; and
  a gate electrode covered with an insulator film and placed inside a trench,
  wherein
  a part of the body contact layer placed near a part of the IGBT region in which trench depth is great is made larger than a part of the body contact layer placed near a part of the IGBT region in which trench depth is shallow.

* * * * *